(12) United States Patent
Saito et al.

(10) Patent No.: US 9,425,271 B2
(45) Date of Patent: Aug. 23, 2016

(54) INSULATED-GATE BIPOLAR TRANSISTOR

(75) Inventors: Jun Saito, Nagoya (JP); Satoru Machida, Aichi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/002,752

(22) PCT Filed: Mar. 7, 2012

(86) PCT No.: PCT/IB2012/000418
§ 371 (c)(1),
(2), (4) Date: Sep. 9, 2013

(87) PCT Pub. No.: WO2012/120359
PCT Pub. Date: Sep. 13, 2012

(65) Prior Publication Data
US 2014/0054645 A1    Feb. 27, 2014

(30) Foreign Application Priority Data
Mar. 9, 2011 (JP) .................. 2011-052100

(51) Int. Cl.
| | |
|---|---|
| H01L 29/423 | (2006.01) |
| H01L 29/739 | (2006.01) |
| H01L 29/10 | (2006.01) |
| H01L 29/06 | (2006.01) |
| H01L 29/08 | (2006.01) |

(52) U.S. Cl.
CPC .......... *H01L 29/423* (2013.01); *H01L 29/0696* (2013.01); *H01L 29/1095* (2013.01); *H01L 29/4238* (2013.01); *H01L 29/7395* (2013.01); *H01L 29/7397* (2013.01); *H01L 29/0619* (2013.01); *H01L 29/0623* (2013.01); *H01L 29/0847* (2013.01)

(58) Field of Classification Search
None
See application file for complete search history.

(56) References Cited

U.S. PATENT DOCUMENTS

| | | | |
|---|---|---|---|
| 5,391,898 A * | 2/1995 | Hagino | ............... 257/139 |
| 5,744,826 A | 4/1998 | Takeuchi et al. | |
| 5,751,024 A | 5/1998 | Takahashi | |
| 7,026,215 B2 * | 4/2006 | Aoki et al. | ............... 438/270 |
| 2002/0006703 A1 | 1/2002 | Pfirsch et al. | |
| 2004/0036121 A1 | 2/2004 | Aoki et al. | |
| 2004/0183128 A1 | 9/2004 | Muraoka et al. | |

(Continued)

FOREIGN PATENT DOCUMENTS

| | | |
|---|---|---|
| CN | 100514675 C | 7/2009 |
| EP | 1 760 790 A1 | 3/2007 |

(Continued)

*Primary Examiner* — Peniel M Gumedzoe
(74) *Attorney, Agent, or Firm* — Oliff PLC

(57) ABSTRACT

In an IGBT, a trench extending in a bent shape to have a corner is formed in an upper surface of a semiconductor substrate. The inside of the trench is covered with an insulating film. A gate is placed inside the trench. An emitter and a collector are formed on an upper surface and a lower surface of the semiconductor substrate, respectively. An emitter region, a body region, a drift region, and a collector region are formed in the semiconductor substrate. The emitter region is formed of an n-type semiconductor, is in contact with the insulating film, and is in ohmic contact with the emitter electrode. The body region is formed of a p-type semiconductor, is in contact with the insulating film below the emitter region, is in contact with the insulating film of an inner corner portion of the trench, and is in ohmic contact with the emitter electrode.

8 Claims, 13 Drawing Sheets

(56) References Cited

U.S. PATENT DOCUMENTS

| | | |
|---|---|---|
| 2005/0161735 A1 | 7/2005 | Aoki et al. |
| 2006/0081919 A1 | 4/2006 | Inoue et al. |
| 2007/0114598 A1* | 5/2007 | Hotta et al. .................. 257/330 |
| 2008/0012040 A1* | 1/2008 | Saito et al. .................. 257/133 |
| 2010/0308401 A1 | 12/2010 | Narazaki |

FOREIGN PATENT DOCUMENTS

| | | |
|---|---|---|
| JP | A-4-162572 | 6/1992 |
| JP | A-8-316479 | 11/1996 |
| JP | A-10-290010 | 10/1998 |
| JP | H11-345969 A | 12/1999 |
| JP | 2002-158355 A | 5/2002 |
| JP | A-2002-190595 | 7/2002 |
| JP | A-2004-55976 | 2/2004 |
| JP | A-2006-120789 | 5/2006 |
| JP | A-2007-266134 | 10/2007 |
| JP | 2009-026797 A | 2/2009 |
| JP | A-2010-114136 | 5/2010 |
| JP | A-2010-283128 | 12/2010 |
| WO | WO 00/38244 A1 | 6/2000 |
| WO | WO 2005/109521 A1 | 11/2005 |

* cited by examiner

INSULATED-GATE BIPOLAR TRANSISTOR

BACKGROUND OF THE INVENTION

1. Field of the Invention

The invention relates to an insulated-gate bipolar transistor (IGBT).

2. Description of Related Art

Japanese Patent Application Publication No. 2010-114136 (JP 2010-114136 A) describes an IGBT that has gate electrodes formed in trenches. In this IGBT, the gate electrodes extend in stripes. That is, the gate electrodes extend straight in parallel to each other.

In order to reduce the loss that occurs in an IGBT, it is preferable to reduce the on-resistance of the IGBT. With an IGBT that has gate electrodes that extend in stripes, as in JP 2010-114136 A, the on-resistance can be reduced if the mesa width (i.e., the interval between adjacent gate electrodes) is reduced. However, to reduce the mesa width, a manufacturing process in which fine processing is possible is necessary, which ends up increasing the manufacturing cost of the IGBT.

SUMMARY OF THE INVENTION

The invention provides technology, with which it is made possible to reduce the on-resistance of an insulated-gate bipolar transistor (IGBT), by a structure that differs from that of the technology that reduces the mesa width described above.

An IGBT according to an aspect of the invention includes: a semiconductor substrate; an emitter electrode; a collector electrode; and a gate electrode, wherein: a trench that is formed in a first major surface of the semiconductor substrate, which is one major surface of the semiconductor substrate, the trench extending in a bent shape to have a corner in a plan view of the semiconductor substrate on the first major surface side; an inside surface of the trench is covered with an insulating film; the gate electrode is placed inside the trench; the emitter electrode is formed on the first major surface of the semiconductor substrate; the collector electrode is formed on a second major surface of the semiconductor substrate, which is the other major surface of the semiconductor substrate; and the semiconductor substrate includes therein: an emitter region that is formed of an n-type semiconductor, is in contact with the insulating film, and is in ohmic contact with the emitter electrode; a body region that is formed of a p-type semiconductor, is in contact with the insulating film at a position adjacent to the emitter region and is in contact with the insulating film at an inside corner portion of the trench, and is in ohmic contact with the emitter electrode; a drift region that is formed of an n-type semiconductor, is formed on a side closer to the second major surface with respect to the body region, is separated from the emitter region by the body region, and is in contact with the insulating film of a second major surface-side end portion of the trench; and a collector region that is formed of a p-type semiconductor, is formed on a side closer to the second major surface with respect to the drift region, is separated from the body region by the drift region, and is in ohmic contact with the collector electrode.

The emitter region may be in contact with the insulating film at any position. For example, the emitter region may be in contact with the insulating film at the inside corner portion of the trench, or may be in contact with the insulating film at another position. Also, as long as the body region is in contact with the insulating film at a position adjacent to the emitter region and is in contact with the insulating film at the inside corner portion of the trench, the body region may be either in contact with or not in contact with the insulating film at another position. Also, the phrase "inside corner portion of the trench" above refers to a portion near the corner on the inner side, or the minor angle side, of the portion where the trench is bent, that is, the corner. Also, the phrase "trench extending in a bent shape to have a corner in a plan view of the semiconductor substrate on the first major surface side" also includes a trench, in which sections thereof meet at three-way junctions or four-way junctions. The trench having junctions may be regarded as a combination of trenches each extending in a bent shape.

When the IGBT is on, channels are formed in the body region in the areas where the body region is in contact with the insulating film, and electrons flow from the emitter region to the drift region through these channels. Electrons flow to the collector region through the drift region. At the same time, holes flow from the collector region into the drift region, and as a result, the electrical resistance of the drift region decreases. The holes in the drift region flow toward the body region. At this time, the holes in the drift region under the gate electrode flow so as to round, or pass by, the gate electrode, so that the concentration of holes becomes high in the drift region near the side surface of the lower end portion of the gate electrode. In particular, the holes that round, or pass by, the gate electrode concentrate in the drift region near the inside corner portion of the trench. Therefore, in the drift region near the inside corner portion, the concentration of holes becomes very high, so that the electrical resistance becomes very low. In this IGBT, a body region is formed so as to be in contact with the insulating film of the inside corner portion of the trench. That is, channels are formed at positions that are in contact with the insulating film of the inside corner portion. Electrons flow into the drift region near the inside corner portion (i.e., into the region where the electrical resistance is very low described above) through these channels of the inside corner portions. Therefore, electrons can pass through the drift region with low loss. Accordingly, this IGBT has low on-resistance.

In the IGBT according to the above aspect, the semiconductor substrate may further include therein a barrier region that separates the body region into a first major surface-side body region and a second major surface-side body region; the first major surface-side body region is in contact with the emitter region; the barrier region is formed of an n-type semiconductor, and is formed on a side closer to the second major surface with respect to the first major surface-side body region; and the second major surface-side body region is formed on a side closer to the second major surface with respect to the barrier region.

According to this kind of structure, holes are inhibited from flowing from the drift region to the first major surface-side body region by the barrier region. Therefore, it is possible to further increase the concentration of holes in the drift region, so that it is possible to further reduce the on-resistance of the IGBT.

Alternatively, in the IGBT according to the above aspect, a high concentration n-type region may be formed between the body region and the drift region, and the high concentration n-type region may be formed of an n-type semiconductor, be in contact with the body region, be separated from the emitter region by the body region, be in contact with the drift region, separate the body region from the drift region, and be higher in concentration of n-type impurity than the drift region.

According to this kind of structure, holes are inhibited from flowing from the drift region to the body region by the high concentration n-type region. Therefore, it is possible to further increase the concentration of holes in the drift region, so that it is possible to reduce the on-resistance of the IGBT.

In the IGBT according to the above aspect, the body region may have a first region that is in ohmic contact with the emitter electrode, and a second region that is electrically continuous with the emitter electrode through the first region; the first region may be not in contact with the insulating film; the second region may be in contact with the insulating film; and the emitter region may be not in contact with the insulating film of the inside corner portion of the trench. The term, "electrically continuous with", herein means "electrically connected to, without Schottky barrier,".

If the emitter region is in contact with the insulating film of the inside corner portion of the trench, the distance from the emitter region near the inside corner portion to the first region increases, so that the potential of the second region near that emitter region tends to increase. As a result, holes may end up flowing from the second region into the emitter region and cause latch up in the IGBT. If the emitter region is formed so as to be not in contact with the insulating film of the inside corner portion of the trench, like the structure described above, the potential of the second region near the emitter region will not easily increase, so that the possibility of latch up in the IGBT is reduced.

In the IGBT according to the above aspect, a rectangular region may be defined by the trench in the plan view of the semiconductor substrate on the first major surface side; the emitter region and the body region may be formed in the rectangular region; and in the rectangular region in the plan view of the semiconductor substrate, a total length of a boundary line where the emitter region is in contact with the insulating film may be shorter than a total length of a boundary line where the body region is in contact with the insulating film.

Shortening the total length of the boundary line where the emitter region is in contact with the insulating film in this way enables the current density that flows through the channels to be increased. Therefore, the saturation current of the IGBT is reduced, which makes it possible to inhibit large electric current from flowing in the IGBT when overvoltage is applied to the IGBT.

In the IGBT according to the above aspect, a plurality of rectangular regions may be defined by the trench in the plan view of the semiconductor substrate on the first major surface side; a plurality of the rectangular regions may be aligned in a first direction and be staggered in a second direction that is orthogonal to the first direction by alternately shifting the rectangular regions by an amount of half a dimension of each of the rectangular regions along the first direction, and a ratio of the dimension along the first direction to a dimension of each of the rectangular regions along the second direction may be within a range between 0.4 and 2.5 inclusive.

Having the ratio be within the range described above enables the on-resistance of an IGBT to be effectively reduced.

In the IGBT according to the above aspect, the rectangular region may be square. The trench may be bent at an angle of 90 degrees at the corner in the plan view. Alternatively, the trench may be bent at an angle of 60 degrees at the corner in the plan view. Alternatively, the trench may be bent at an angle of 120 degrees at the corner in the plan view.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
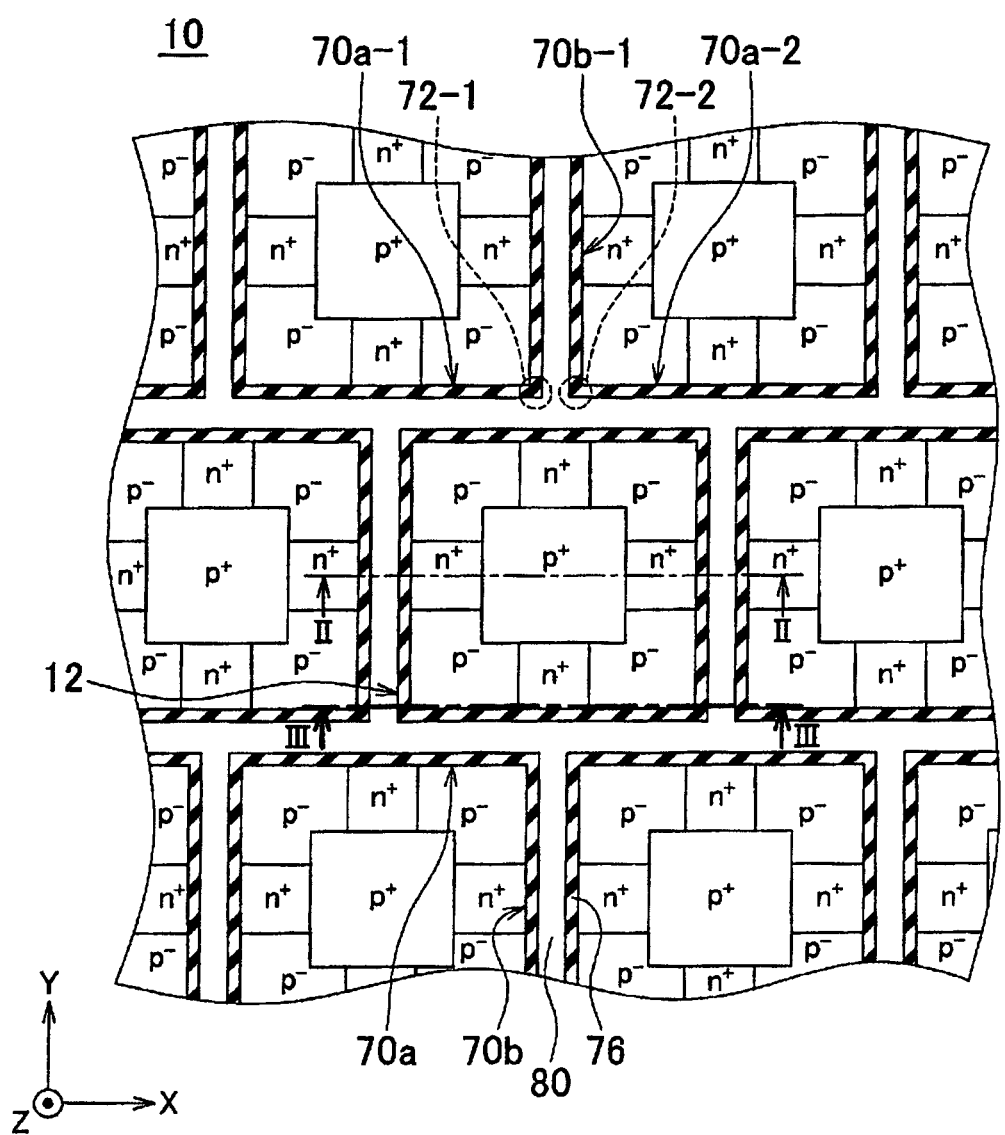
FIG. 1 is a plan view of an IGBT.
Figure 2:
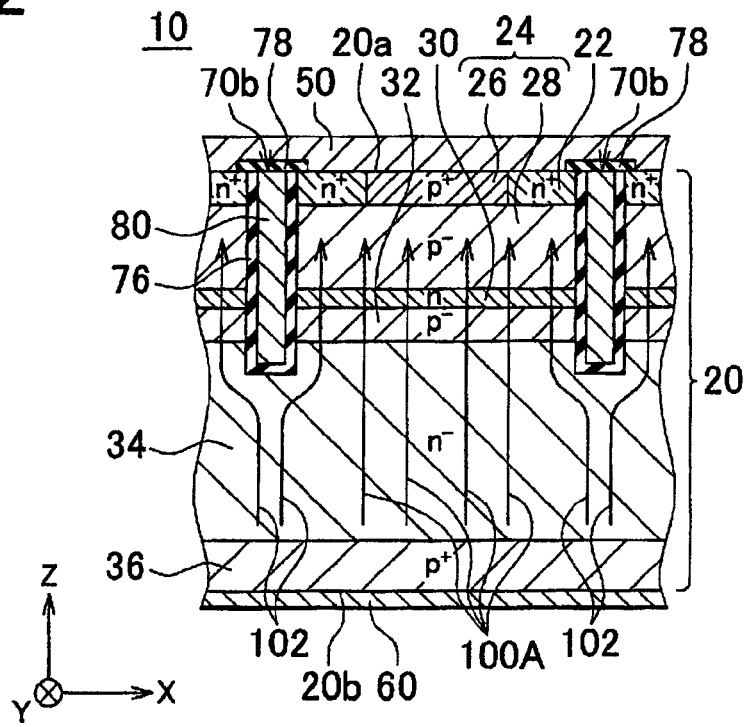
FIG. 2 is a vertical sectional view of the IGBT taken along line II-II in FIG. 1.
Figure 3:
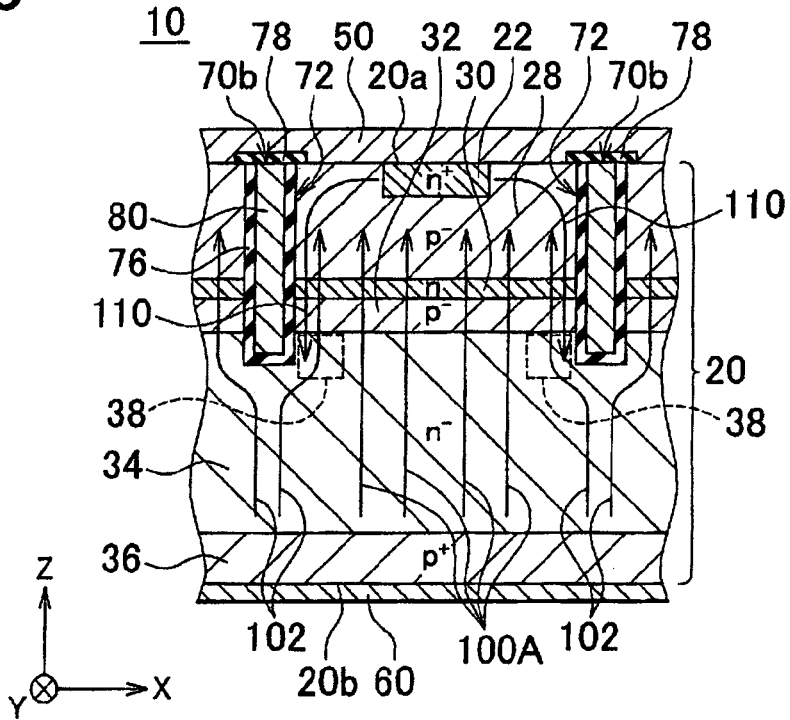
FIG. 3 is a vertical sectional view of the IGBT taken along line III-III in FIG. 1.

As shown in FIGS. 1 to 3, an IGBT 10 has a semiconductor substrate 20, an emitter electrode 50, and a collector electrode 60. As shown in FIGS. 2 and 3, the emitter electrode 50 is formed on almost an entire upper surface 20a of the semiconductor substrate 20, and the collector electrode 60 is formed on almost an entire lower surface 20b of the semiconductor substrate 20. For convenience of explanation, in some cases, the direction, in which the first major surface of the invention faces, is assumed to be the upward direction and the direction, in which the second major surface of the invention faces, is assumed to be the downward direction. Thus, the upper surface 20a may be regarded as the first major surface of the invention and the lower surface 20b may be regarded as the second major surface of the invention. In FIG. 1, the structure above the upper surface 20a of the semiconductor substrate 20, such as the emitter electrode 50 etc., is omitted in order to show the arrangement of each region in the semiconductor substrate 20.

Trenches 70a and 70b (hereinafter also referred to collectively as "trenches 70") are formed in the upper surface 20a of the semiconductor substrate 20. As shown in FIGS. 2 and 3, the trenches 70 extend substantially perpendicular (i.e., in the Z direction in the drawings) to the upper surface 20a of the semiconductor substrate 20 in the depth direction. As shown in FIG. 1, when the upper surface 20a of the semiconductor substrate 20 is viewed from above, the trenches 70a extend straight in the X direction. Also, when the upper surface 20a of the semiconductor substrate 20 is viewed from above, the trenches 70b extend straight in the Y direction. The X direction is orthogonal to the Y direction. The trenches 70a and the trenches 70b are formed so as to meet each other in three-way junctions (i.e., T-junctions). The upper surface 20a of the semiconductor substrate 20 is divided into square regions by these trenches 70a and 70b. Hereinafter, the regions that are defined by the trenches 70 will be referred to as cells 12. Each cell 12 is square. The cells 12 are aligned in the X direction, and are staggered in the Y direction (i.e., offset along the X direction) by alternately shifting the cells by the amount of half a cell in the X direction. The portions where the trenches 70a and the trenches 70b meet at three-way junctions may be regarded as portions where the trenches 70 extend bent. For example, when a trench 70a-1 and a trench 70b-1 shown in FIG. 1 are regarded as one continuous trench, this trench may be said to extend bent at 90 degrees. In this case, the portion on the inner side of the corner of the trench (hereinafter simply referred to as the "inside corner portion") is a portion denoted by reference numeral 72-1 in FIG. 1. Also, when a trench 70a-2 and the trench 70b-1 in FIG. 1 are regarded as one continuous trench, this trench may also be said to extend bent at 90 degrees. In this case, the inside corner portion of the trench is the portion denoted by reference numeral 72-2 in FIG. 1. In this way, the junction of the trenches 70a and the trenches 70b may be regarded as the portion where the trenches 70 extend bent, and each junction has an inside corner portion 72. Therefore, one cell has four inside corner portions 72.

The inside surface (i.e., the bottom surface and the inside wall surfaces) of the trenches 70 is covered with an insulating film 76. A gate electrode 80 is formed inside the trenches 70. The gate electrode 80 is filled into the trenches 70 so that there are no gaps. The gate electrode 80 faces a semiconductor layer inside of the semiconductor substrate 20 through the insulating film 76. The gate electrode 80 is insulated from the semiconductor layer inside of the semiconductor substrate 20 by the insulating film 76. Also, as shown in FIGS. 2 and 3, the upper surface of the gate electrode 80 is covered with an insulating film 78, and the emitter electrode 50 is formed so as to cover this insulating film 78. The gate electrode 80 is insulated from the emitter electrode 50 by the insulating film 78. The gate electrode 80 is connected to a pad at a position that is not shown, and it is possible to control the potential of the gate electrode 80 through this pad.

Figure 4:
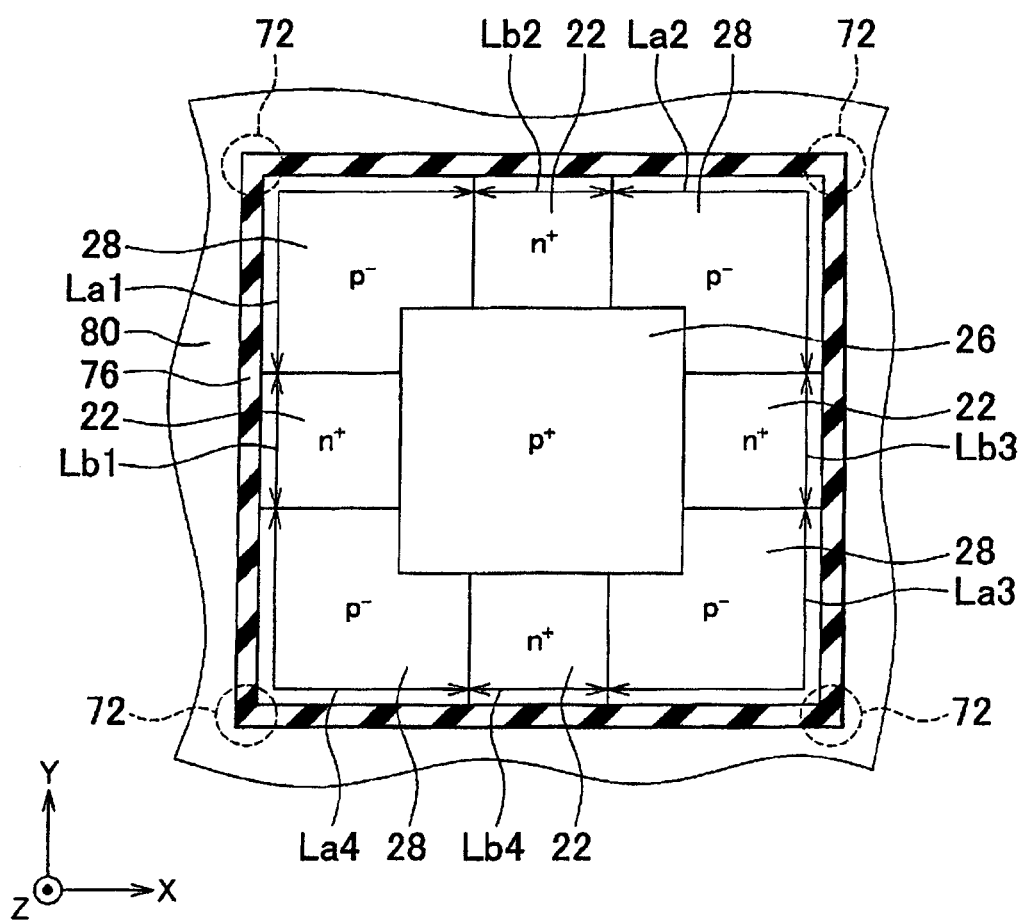
FIG. 4 is an enlarged plan view of one of cells shown in FIG. 1.

Next, the structure of the semiconductor layer inside the semiconductor substrate 20 in each cell 12 will be described. The structure of each cell 12 is the same, so the structure of one cell 12 will be described below. FIG. 4 is an enlarged plan view of one cell 12. As shown in FIGS. 2 to 4, an emitter region 22, an upper body region 24, a barrier region 30, a lower body region 32, a drift region 34, and a collector region 36 are all formed inside of the semiconductor substrate 20. The upper body region 24 includes a body contact region 26 and a low concentration body region 28.

The body contact region 26 is formed of a p-type semiconductor that is high in concentration of p-type impurity. The body contact region 26 is formed in a region near the upper surface 20a that includes the upper surface 20a of the semiconductor substrate 20 (hereinafter, this region will be referred to as a "surface layer region on the upper surface 20a side"). The body contact region 26 is formed in substantially the center of the cell 12. The body contact region 26 is not in contact with the insulating film 76. The body contact region 26 is in ohmic contact with the emitter electrode 50.

The emitter region 22 is formed of an n-type semiconductor that is high in concentration of n-type impurity. Four emitter regions 22 are formed in one cell 12. Each emitter region 22 is formed in a surface layer region on the upper surface 20a side of the semiconductor substrate 20. The emitter regions 22 are formed around the body contact region 26 and contact the body contact region 26. The emitter regions 22 are formed so as to avoid the corners (i.e., the regions near the inside corner portions 72) of the cell 12. The emitter regions 22 contact the portions of the insulating film 76 that extend straight. The emitter regions 22 are in ohmic contact with the emitter electrode 50.

The low concentration body region 28 is formed of a p-type semiconductor that is lower in concentration of p-type impurity than the body contact region 26. The low concentration body region 28 is formed in a surface layer region on the upper surface 20a side at the corners of the cell 12. That is, the low concentration body region 28 is formed in a surface layer region on the upper surface 20a side in areas where neither the emitter region 22 nor the body contact region 26 is formed. Moreover, the low concentration body region 28 is formed across the entire region in the horizontal direction (i.e., the X direction and the Y direction) of the cell 12, at a depth below the emitter region 22 and the body contact region 26. As shown in FIG. 3, the low concentration body region 28 in the surface layer region is connected to the low concentration body region 28 that is at a depth below the emitter region 22 and the body contact region 26. The low concentration body region 28 is in contact with the emitter region 22 and the body contact region 26. The low concentration body region 28 is in contact with the emitter electrode 50. However, the n-type impurity concentration of the low concentration body region 28 is low, so the low concentration body region 28 is in schottky contact with the emitter electrode 50. The low concentration body region 28 is electrically connected to the emitter electrode 50 via the body contact region 26. The low concentration body region 28 is in contact with the insulating film 76. In particular, as shown in FIGS. 3 and 4, the low concentration body region 28 is in contact with the insulating film 76 that is at the inside corner portions 72.

The barrier region 30 is formed of an n-type semiconductor that is low in concentration of n-type impurity. The barrier region 30 is formed across the entire region in the horizontal direction of the cell 12, at a depth below the low concentration body region 28, i.e., in a position deeper than the low concentration body region 28. The barrier region 30 is in contact with the low concentration body region 28. The barrier region 30 is separated from the emitter region 22 and the body contact region 26 by the low concentration body region 28. The barrier region 30 is in contact with the insulating film 76.

The lower body region 32 is formed of a p-type semiconductor that is lower in concentration of p-type impurity than the body contact region 26. The lower body region 32 is formed across the entire region in the horizontal direction of the cell 12, at a depth below the barrier region 30, i.e., in a position deeper than the barrier region 30. The lower body region 32 is in contact with the barrier region 30. The lower body region 32 is separated from the low concentration body region 28 by the barrier region 30. The lower body region 32 is in contact with the insulating film 76.

The drift region 34 is formed of an n-type semiconductor that is low in concentration of n-type impurity. The drift region 34 is formed across the entire region in the horizontal direction of the semiconductor substrate 20, at a depth below the lower body region 32, i.e., in a position deeper than the lower body region 32. The drift region 34 is in contact with the lower body region 32. The drift region 34 is separated from the barrier region 30 by the lower body region 32. The lower end portions of the trenches 70 reach the drift region 34. The drift region 34 is in contact with the insulating film 76 of the lower end portion of the trenches 70.

The collector region 36 is formed of a p-type semiconductor that is high in concentration of p-type impurity. The collector region 36 is formed across the entire region in the horizontal direction of the semiconductor substrate 20, in a region near the lower surface 20b that includes the lower surface 20b of the semiconductor substrate 20 (hereinafter, this region will be referred to as the "surface layer region on the lower surface 20b side"). The collector region 36 is in ohmic contact with the collector electrode 60. The collector region 36 is in contact with the drift region 34. The collector region 36 is separated from the lower body region 32 by the drift region 34.

Lengths La1 to La4 of FIG. 4 respectively indicate the lengths, measured when the upper surface 20a is viewed from above, of boundary lines where the four low concentration body regions 28 in the surface layer region on the upper surface 20a side contact the insulating film 76. Lengths Lb1 to Lb4 in FIG. 4 respectively indicate the lengths, measured when the upper surface 20a is viewed from above, of boundary lines where the four emitter regions 22 contact the insulating film 76. A sum Lb of the lengths Lb1 to Lb4 is less than a sum La of the lengths La1 to La4.

Next, the operation of the IGBT 10 will be described. When the IGBT 10 is turned on, voltage of equal to or greater than a threshold value is applied to the gate electrode 80 while voltage that makes the collector electrode 60 positive is applied between the collector electrode 60 and the emitter electrode 50. As a result, the upper body region 24 and the lower body region 32 in the areas where they contact the insulating film 76 reverse to n-type, so that channels are formed. For example, in the cross section shown in FIG. 2, channels are formed in the upper body region 24 and the lower body region 32 in the areas where the upper body region 24 and the lower body region 32 contact the insulating film 76 of the trenches 70b that extend in the Y direction. Also, as shown in FIG. 1, the cross section in FIG. 3 is a cross section of the semiconductor layer near the insulating film 76 of the trench 70a that extends in the X direction. Therefore, the channels are formed by the gate electrode 80 that extends in the X direction in the entire lower body region 32 and the entire upper body region 24 (i.e., low concentration body region 28) that appear in the cross section in FIG. 3. When these channels are formed, electrons flow from the emitter electrode 50 into the drift region 34 through the emitter region 22 and the channels. At the same time, holes flow from the collector electrode 60 into the drift region 34 through the collector region 36. When this happens, the electrical resistance of the drift region 34 decreases due to a conductivity modulation phenomenon. Electrons that have flowed into the drift region 34 flow through the drift region 34 and the collector region 36 and into the collector electrode 60. In this way, current flows in the IGBT by electrons flowing from the emitter electrode 50 to the collector electrode 60.

Also, the holes that have flowed into the drift region 34 then flow into the upper body region 24 through the lower body region 32 and the barrier region 30, and then from the body contact region 26 into the emitter electrode 50, as shown by arrows 100A in FIGS. 2 and 3. At this time, the barrier region 30 serves as a barrier that blocks the flow of holes. Therefore, holes are inhibited from flowing to the upper body region 24. As a result, the concentration of holes in the drift region 34 increases, so that the electrical resistance of the drift region 34 further decreases.

Figure 5:
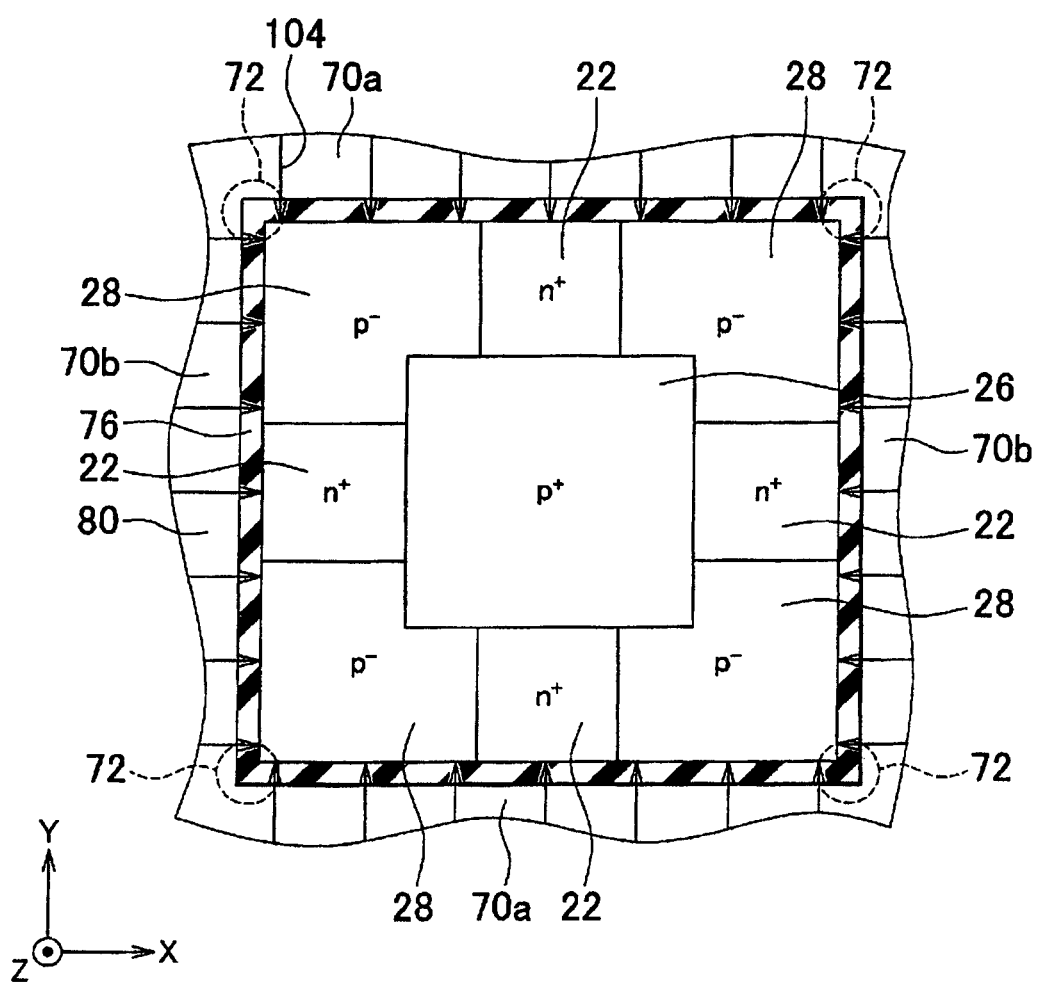
FIG. 5 is an enlarged plan view of one of the cells shown in FIG. 1.

Also, a positive potential is applied to the gate electrode 80, so that the holes inside the drift region 34 below the gate electrode 80 flow so as to avoid the gate electrode 80, as shown by arrows 102 in FIGS. 2 and 3. This flow of holes becomes a flow such as that indicated by arrows 104 in FIG. 5, when shown in the X-Y direction. As is evident from FIG. 5, at the inside corner portions 72 of the trenches 70, the flow of holes that avoid the gate electrode 80 inside the trenches 70a that extend in the X direction merges with the flow of holes that avoid the gate electrode 80 inside the trenches 70b that extend in the Y direction. Therefore, in the drift region 34 (i.e., region 38 in FIG. 3) near the inside corner portions 72, the concentration of holes becomes extremely high, so that the electrical resistance becomes extremely low. Also, as described above, channels are formed in the upper body region 24 and the lower body region 32 that contact the insulating film 76 of the inside corner portions 72. Therefore, many electrons flow into the region 38 that is the drift region 34 near the inside corner portion 72 through the channels near the inside corner portions 72, as shown by arrows 110 in FIG. 3. The electrical resistance of the region 38 is extremely low, so that the electrons flow into the collector electrode 60 with little loss in the drift region 34.

Figure 6:
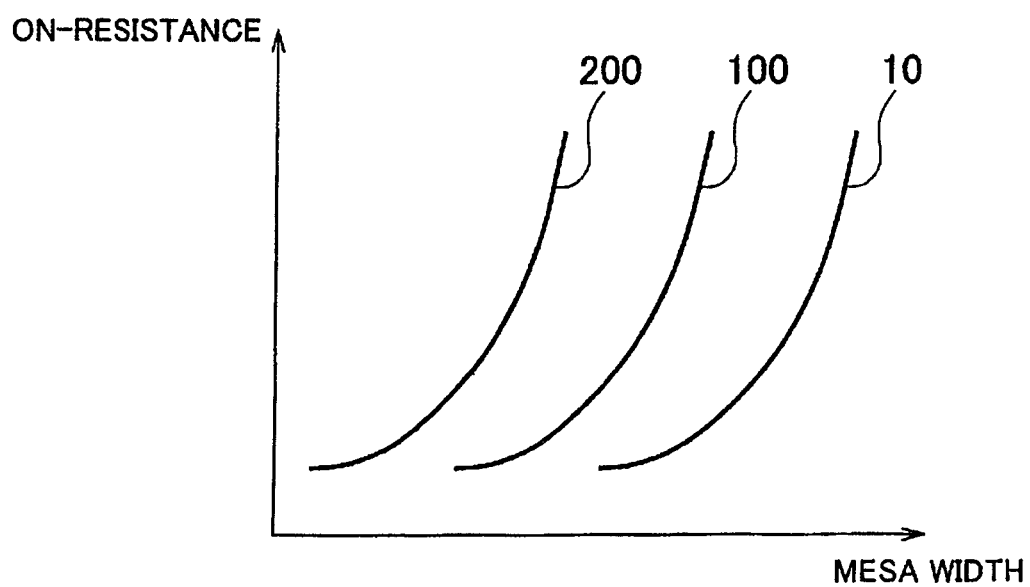
FIG. 6 is a graph comparing the on-resistances of IGBTs.

As described above, in the IGBT 10, the trenches 70 are formed in bent shapes. Also, in the upper body region 24 and the lower body region 32, channels are formed in areas where the upper body region 24 and the lower body region 32 contact the insulating film 76 of the inside corner portions 72, and electrons flow into the drift region 34 from the channels of the inside corner portions 72. Meanwhile, holes concentrate in the drift region 34 (i.e., the region 38) near the inside corner portions 72. Moreover, an effect of accumulating the holes in the drift region 34 is also obtained by the barrier region 30. As a result, the on-resistance of the IGBT 10 is reduced. It is possible to reduce the on-resistance of the IGBT 10 also when only one of the structure for accumulating holes in the drift region 34 by the barrier region 30 and the structure for concentrating the holes in the drift region 34 near the inside corner portions 72 is employed. However, employing both of these structures is preferable. FIG. 6 is a graph showing the results of a simulation for evaluating the on-resistance of the IGBT 10 according to this example embodiment, an IGBT 200 having stripe-shaped gate electrodes according to the related art, and an IGBT 100 having a structure in which the barrier region 30 has been removed from the IGBT 10 of the example embodiment. The horizontal axis represents the mesa width, and the vertical axis represents the on-resistance. As shown in the graph, with all of the IGBTs, the on-resistance decreases as the mesa width becomes smaller. Also, as is evident from FIG. 6, with the IGBT 200 according to the related art, the on-resistance is not reduced unless the mesa width is made extremely small. In contrast, with the IGBT 10 and the IGBT 100, the on-resistance is reduced even if the mesa width is not made so small. In this simulation, with the IGBT 100, the same on-resistance as that of the IGBT 200 was obtained even when the mesa width was approximately five times that of the IGBT 200 according to the related art, and with the IGBT 10, the same on-resistance as that of the IGBT 200 was obtained even when the mesa width was approximately 25 times that of the IGBT 200 according to the related art. In this way, according to the structure of the example embodiment, it is possible to reduce the on-resistance of the IGBT without fine processing.

As described above, the technology of the example embodiment makes it possible to reduce the on-resistance of the IGBT without setting the mesa width so small. As a result, it is possible to suppress an increase in saturation current of the IGBT (i.e., in collector current that flows when the voltage between the collector and emitter of the IGBT is excessive). Specifically, a method that reduces the on-resistance by reducing the mesa width is used, the channel density (i.e., the area of the channels per unit area of the substrate surface) increases as a result of reducing the mesa width. Therefore, when the IGBT is on, a large number of electrons are supplied from the channels to the drift region, and the holes that are supplied from the collector region to the drift region also increase accordingly. As a result, when overvoltage is applied, a large amount of current easily flows, so that the saturation current increases. In contrast, with the technology of this example embodiment, the on-resistance of the IGBT is reduced without setting the mesa width so small, so that it is possible to suppress the saturation current of the IGBT from increasing. In particular, with the IGBT 10 according to the example embodiment, the sum Lb of the lengths Lb1 to Lb4 is less than the sum La of the lengths La1 to La4, as described above. The width of the channels is the smallest in the regions denoted by the lengths Lb1 to Lb4 (i.e., in the regions where electrons flow from the emitter region 22 into the channels). Therefore, since the sum Lb is small, the effective channel density is low and the saturation current is reduced even further.

The technology of this example embodiment makes it possible to reduce the on-resistance without setting the mesa width so small. However, this technology does not dismiss the reduction of the mesa width. It is possible to reduce the on-resistance of the IGBT even further by employing both this technology and technology that reduces the mesa width. That is, it is possible to use this technology in combination with technology that reduces the mesa width.

Figure 7:
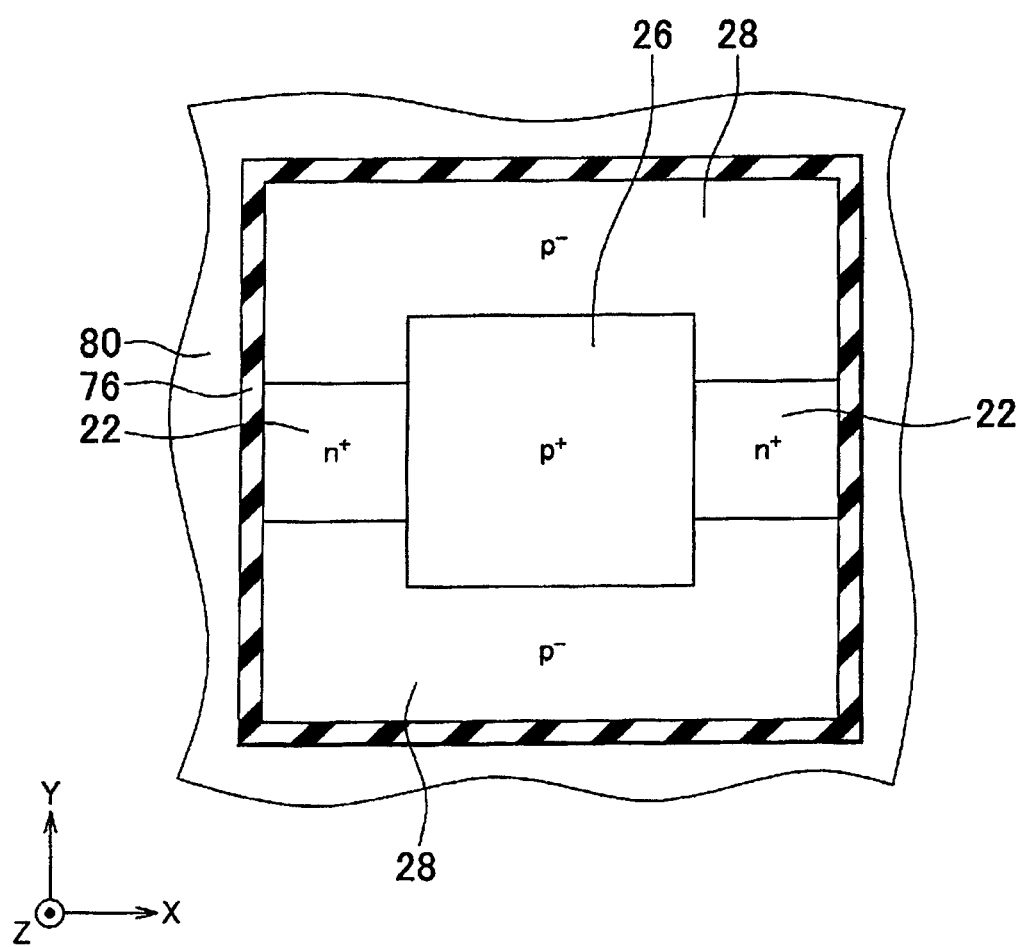
FIG. 7 is a plan view, corresponding to FIG. 4, of an IGBT according to a first modification.

While four emitter regions 22 are formed in a single cell 12 in the IGBT 10 according to this example embodiment, the number of emitter regions 22 may be less than four. For example, as shown in FIG. 7, the number of the emitter regions 22 in a cell 12 may be two. When the emitter regions 22 are formed in this way, the sum Lb of the lengths described above becomes even shorter, so that the saturation current is reduced even more.

Figure 8:
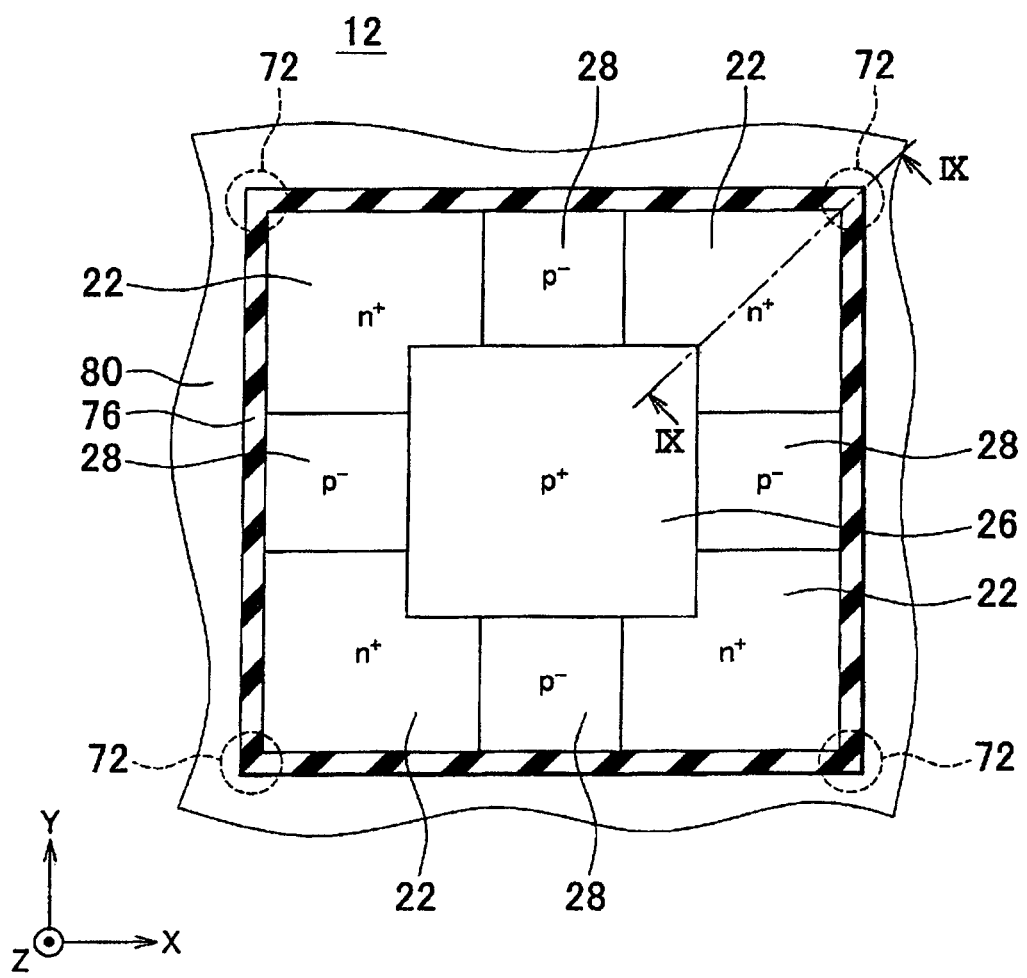
FIG. 8 is a plan view, corresponding to FIG. 4, of an IGBT according to a second modification.
Figure 9:
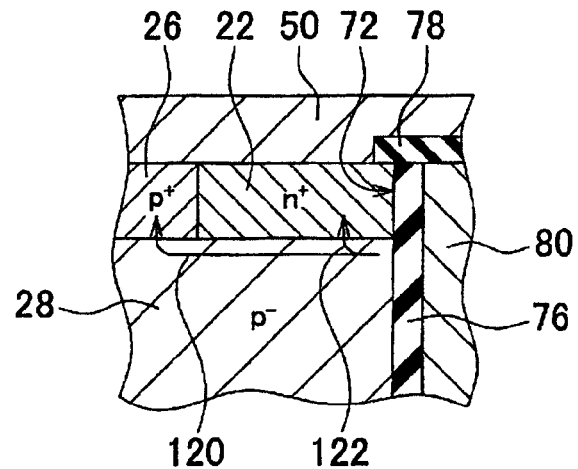
FIG. 9 is a sectional view of an IGBT taken along line IX-IX of FIG. 8.

Also, in the example embodiment described above, the low concentration body region 28 is formed in the surface layer region of the corners of the cell 12. Alternatively, however, the emitter region 22 may be formed in the surface layer region of the corners of the cell 12, as shown in FIG. 8. However, if the emitter region 22 is formed in the surface layer region of the corners of the cell 12, the problems described below may arise. FIG. 9 is a sectional view taken along line IX-IX in FIG. 8. The arrow 120 in FIG. 9 indicates a path when holes inside the low concentration body region 28 below the emitter region 22 flow to the body contact region 26. If the emitter region 22 is formed in the surface layer region of the corners of the cell 12, the direction from the end of the emitter region 22 toward the body contact region 26 (i.e., the direction indicated by line IX-IX in FIG. 8) extends in the diagonal direction of the cell 12, so that the distance from the end of the emitter region 22 to the body contact region 26 becomes longer. Therefore, the movement path of the holes indicated by the arrow 120 in FIG. 9 also becomes longer. When this movement path becomes longer, the potential of the low concentration body region 28 that is below the emitter region 22 becomes higher due to the electrical resistance of the low concentration body region 28. If this potential becomes too high, holes flow into the emitter region 22, as shown by the arrow 122 in FIG. 9, and latch up in the IGBT occurs. When the low concentration body region 28 is formed in the surface layer region of the corners of the cell 12 to form the emitter region 22 within the region relatively near the body contact region 26, like the IGBT 10 in the example embodiment, the possibility of latch up in the IGBT is reduced.

Figure 10:
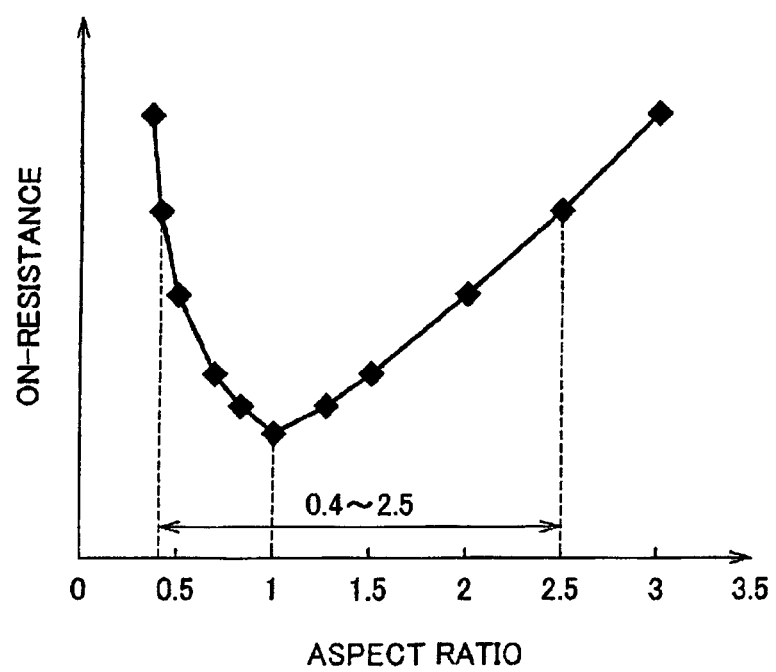
FIG. 10 is a graph showing the relationship between the aspect ratio and the on-resistance.

Also, with the IGBT 10 in the example embodiment, the shape of the cell is square. However, the shape of the cell may be rectangular. FIG. 10 shows the relationship between the aspect ratio of the cell (i.e., the ratio of the length of the cell in the X direction to the length of the cell in the Y direction), and the on-resistance of the IGBT. As shown in FIG. 10, when the aspect ratio is 1 (i.e., when the cell is square), the on-resistance becomes minimum. Also, it has been found that the on-resistance of the IGBT is more effectively reduced when the aspect ratio is within a range of 0.4 to 2.5, inclusive.

Figure 11:
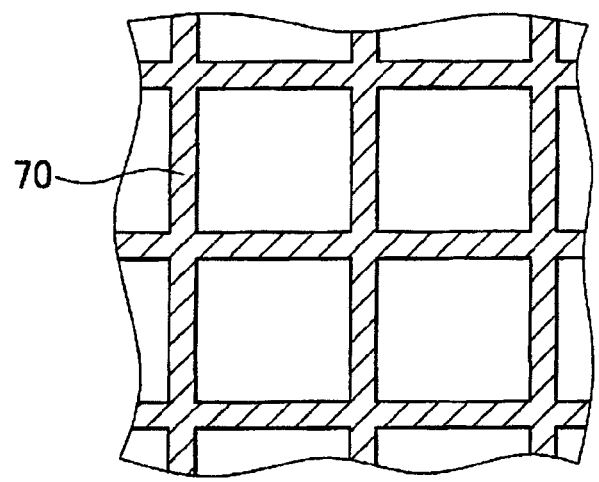
FIG. 11 is a plan view showing an arrangement of trenches of an IGBT according to a third modification.
Figure 12:
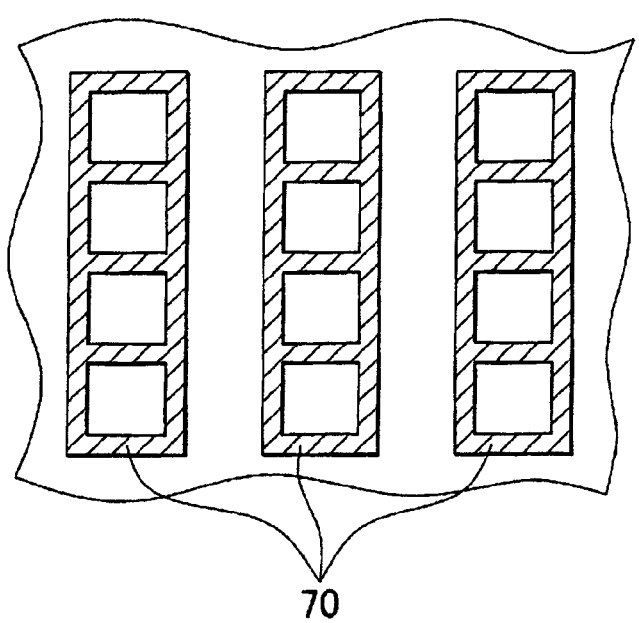
FIG. 12 is a plan view showing an arrangement of trenches of an IGBT according to a fourth modification.
Figure 13:
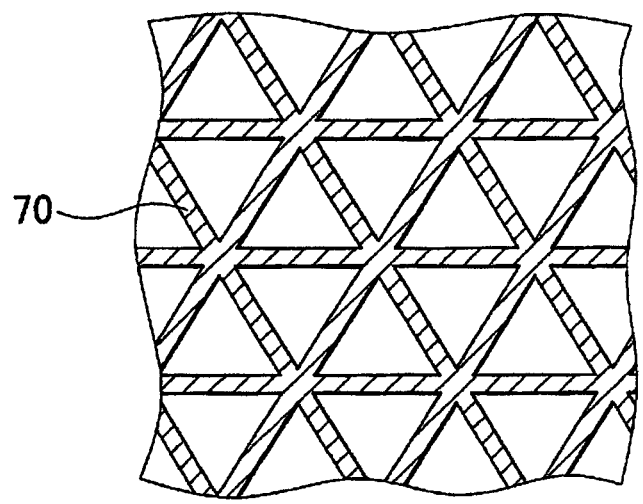
FIG. 13 is a plan view showing an arrangement of trenches of an IGBT according to a fifth modification.
Figure 14:
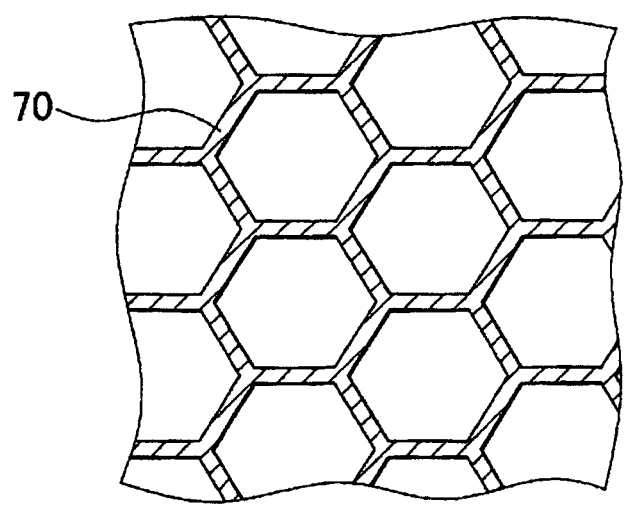
FIG. 14 is a plan view showing an arrangement of trenches of an IGBT according to a sixth modification.
Figure 15:
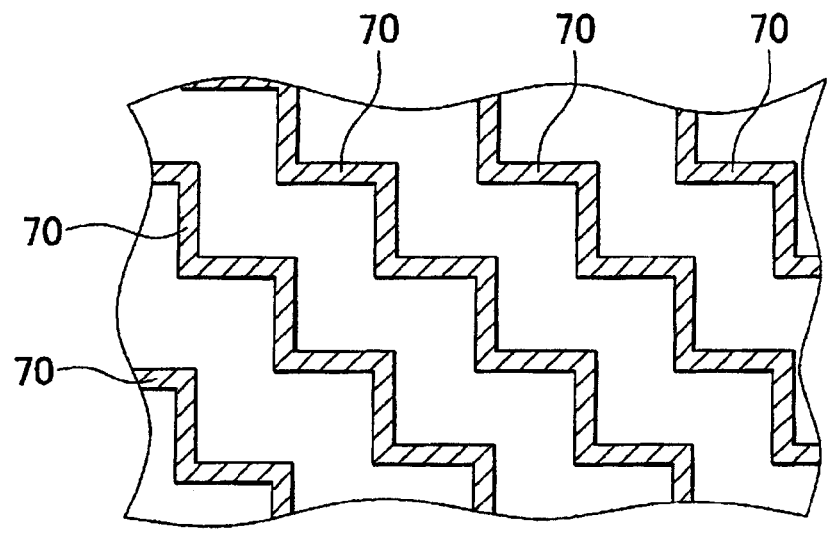
FIG. 15 is a plan view showing an arrangement of trenches of an IGBT according to a seventh modification.
Figure 16:
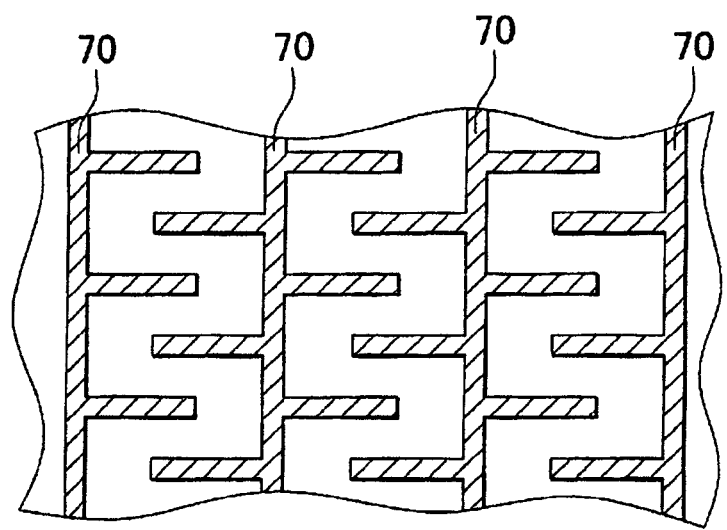
FIG. 16 is a plan view showing an arrangement of trenches of an IGBT according to an eighth modification.
Figure 17:
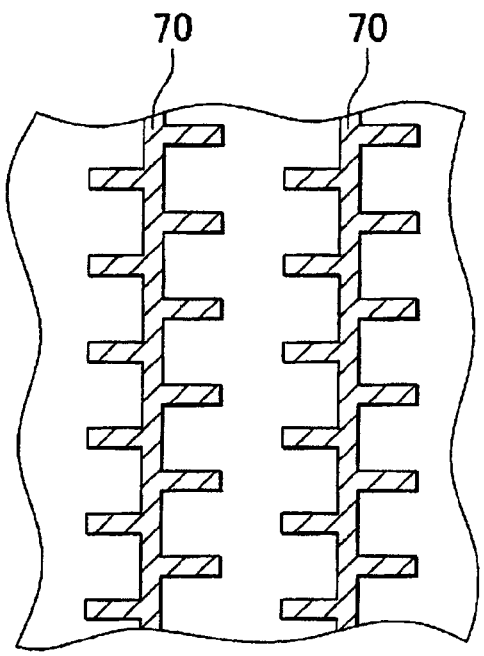
FIG. 17 is a plan view showing an arrangement of trenches of an IGBT according to a ninth modification.
Figure 18:
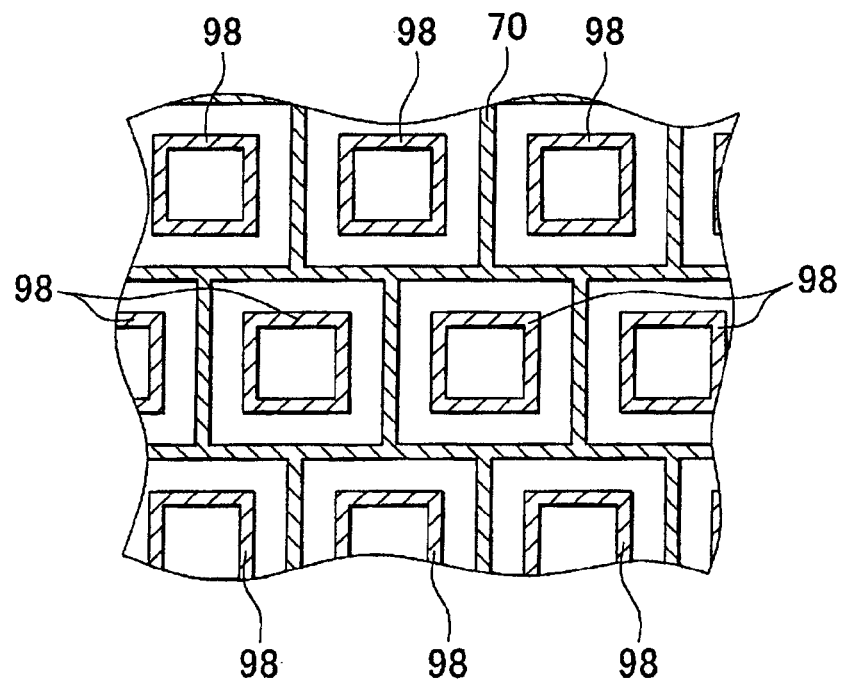
FIG. 18 is a plan view showing an arrangement of trenches of an IGBT according to a tenth modification.
Figure 19:
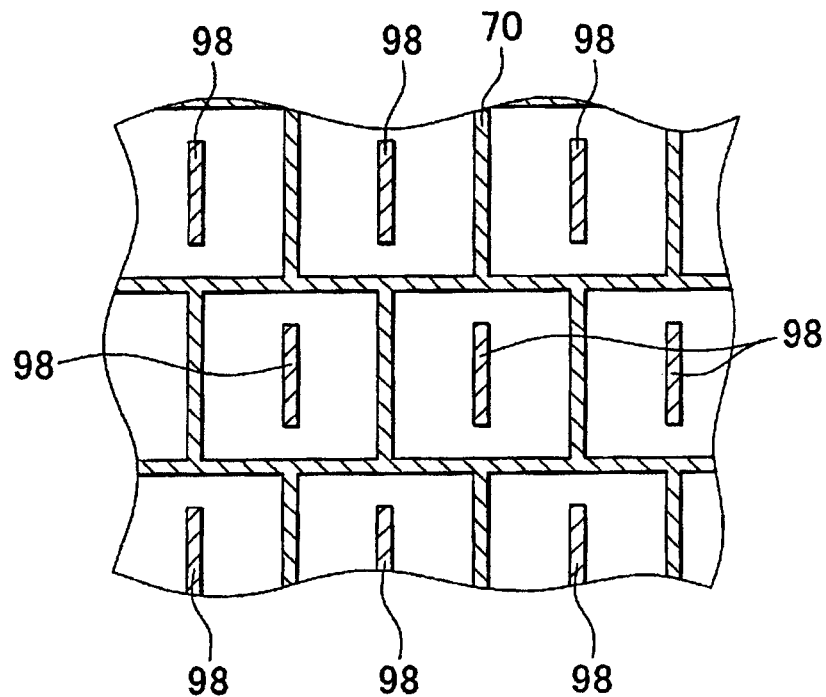
FIG. 19 is a plan view showing an arrangement of trenches of an IGBT according to an eleventh modification.

Further, FIGS. 11 to 19 show arrangements (i.e., arrangements when the upper surface of the semiconductor substrate is viewed from above) of the trench(es) 70 of an IGBT according to modifications. In FIGS. 11 to 19, the trench or trenches 70 are indicated by hatching to make the drawings easier to view. In FIGS. 11 to 19, the structure inside the trench(es) 70 and inside the semiconductor layer is omitted, but the gate electrode and the insulating film are formed in the trenches 70, and the regions of the IGBT are formed in the semiconductor layer. With the arrangements of FIGS. 11 to 19 as well, the trench or trenches 70 are bent, so that the electrical resistance of the drift region is lower near the inside corner portions, and it is possible to reduce the on-resistance of the IGBT. In FIG. 11, the gate electrode forms four-way junctions, but when this kind of structure is employed, a cavity (a space where there is no electrode material) tends to form at the intersections of the trench 70 when embedding the gate electrode in the trench 70 during the manufacturing process of the IGBT, and therefore, three-way junctions are preferable. FIG. 13 shows an example in which the cells are triangular. FIG. 14 shows an example, in which the cells are hexagonal. FIGS. 15 to 17 show examples, in which there are no cells (i.e., in which there are no regions that are surrounded by trenches 70). Further, FIGS. 18 and 19 show examples, in which there are dummy trench electrodes 98. The dummy trench electrodes 98 are electrodes that are formed in the trenches 70, just like the gate electrode, but that are not connected to the outside. That is, the potential of the dummy trench electrodes 98 is floating. The dummy trench electrodes 98 are electrodes for controlling the potential distribution of the semiconductor layer when the IGBT is off. Also in the cases where the trenches 70 are arranged as shown in FIGS. 11 to 19, the on-resistance of the IGBT is reduced by the inside corner portions of the trenches 70.

Figure 20:
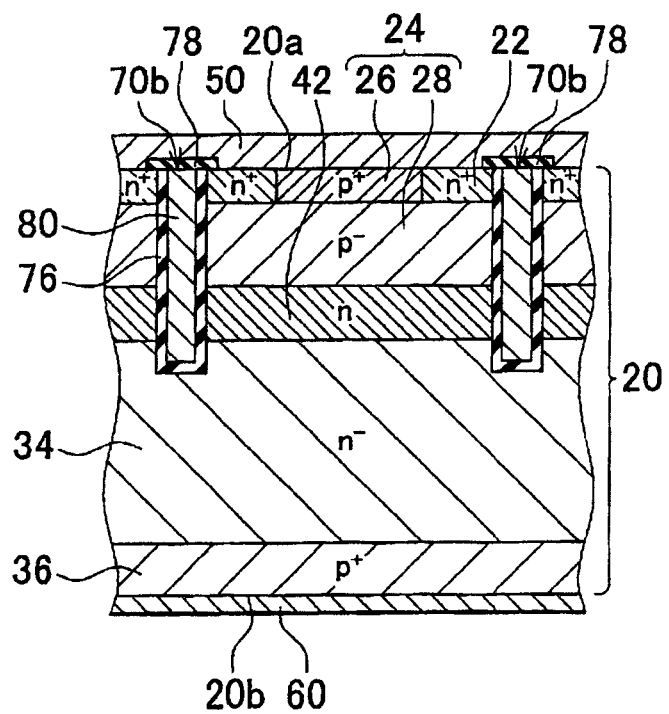
FIG. 20 is a sectional view, corresponding to FIG. 2, of an IGBT according to a twelfth modification.

Moreover, in the IGBT 10 of the example embodiment described above, the barrier region 30 is formed, so that carriers are accumulated in the drift region 34. However, as shown in FIG. 20, a high concentration n-type region 42 that is higher in concentration of n-type impurity than the drift region 34 may be formed between the drift region 34 and the upper body region 24. With this structure, the high concentration n-type region 42 becomes a barrier when holes flow from the drift region 34 to the body region 24. Therefore, this structure also causes holes to be accumulated in the drift region 34, so that the on-resistance of the drift region 34 is reduced. If it is possible to sufficiently reduce the on-resistance with a structure having the inside corner portions 72, the barrier region 30 and the high concentration n-type region 42 may be omitted.

While the invention has been described with reference to example embodiments thereof, it is to be understood that the invention is not limited to the described embodiments or constructions. To the contrary, the invention is intended to cover various modifications and equivalent arrangements. In addition, the technical elements described in the specification and the drawings are technically useful alone or in various combinations and the invention is not limited to the combination described in relation to the above example embodiments. The features described in the specification and the drawings simultaneouly achieve a plurality of objectives and are however technically useful when one of the objectives is achieved.

The invention claimed is:

1. An insulated-gate bipolar transistor (IGBT) comprising:
   a semiconductor substrate;
   an emitter electrode;
   a collector electrode; and
   a gate electrode, wherein:
   a trench that is formed in a first major surface of the semiconductor substrate, which is one major surface of the semiconductor substrate, the trench extending in a bent shape to have a corner in a plan view of the semiconductor substrate on a first major surface side, the trench defining a rectangular region in the plan view of the semiconductor substrate on the first major surface side;
   an inside surface of the trench is covered with an insulating film;
   the gate electrode is placed inside the trench;
   the emitter electrode is formed on the first major surface of the semiconductor substrate;
   the collector electrode is formed on a second major surface of the semiconductor substrate, which is another major surface of the semiconductor substrate; and
   the semiconductor substrate includes therein:
      an emitter region that is formed of an n-type semiconductor, is in contact with the insulating film, and is in ohmic contact with the emitter electrode;
      a body region that is formed of a p-type semiconductor, is in contact with the insulating film at a position adjacent to the emitter region and is in contact with the insulating film at an inside corner portion of the trench, and is in ohmic contact with the emitter electrode;
      a drift region that is formed of an n-type semiconductor, is formed on a side closer to the second major surface with respect to the body region, is separated from the emitter region by the body region, and is in contact with the insulating film at a second major surface-side end portion of the trench; and
      a collector region that is formed of a p-type semiconductor, is formed on a side closer to the second major surface with respect to the drift region, is separated from the body region by the drift region, and is in ohmic contact with the collector electrode; and
   a high concentration n-type region is formed between a portion of the body region and the drift region, wherein the high concentration n-type region is formed of an n-type semiconductor, and is separated from the emitter region by the body region, and the high concentration n-type region separates the portion of the body region from the drift region, and is higher in concentration of n-type impurity than the drift region, and
   the emitter region and the body region are formed in the rectangular region, in the rectangular region in the plan view of the semiconductor substrate, a total length of a boundary line where the emitter region is in contact with the insulating film is shorter than a total length of a boundary line where the body region is in contact with the insulating film,
   in the plan view of the semiconductor substrate, the body region includes a first body region portion and a second body region portion, the first body region portion extending along an entire length between a first corner and a second corner of the rectangular region, and the second body region portion extending along an entire length between a third corner and a fourth corner of the rectangular region, and the emitter region includes no more than a first emitter portion and a second emitter portion, the first emitter portion separating the first body region portion from the second body region portion between the first corner and the third corner of the rectangular region, and the second emitter portion separating the first body region portion from the second body region portion between the second corner and the fourth corner of the rectangular region, and
   wherein the high concentration n-type region is a barrier region that separates the body region into a first major surface-side body region and a second major surface-side body region;
   the first major surface-side body region is in contact with the emitter region;
   the barrier region is formed of an n-type semiconductor, and is formed on a side closer to the second major surface with respect to the first major surface-side body region; and
   the second major surface-side body region is formed on a side closer to the second major surface with respect to the barrier region.

2. The IGBT according to claim 1, wherein
the high concentration n-type region is in contact with the body region and is in contact with the drift region.

3. The IGBT according to claim 1, wherein:
the body region has a first region that is in ohmic contact with the emitter electrode, and a second region that is electrically continuous with the emitter electrode through the first region;
the first region is not in contact with the insulating film;
the second region is in contact with the insulating film; and
the emitter region is not in contact with the insulating film of the inside corner portion of the trench.

4. The IGBT according to claim 1, wherein
a plurality of the rectangular regions are aligned in a first direction and are staggered in a second direction that is orthogonal to the first direction by alternately shifting the rectangular regions by an amount of half a dimension of each of the rectangular regions along the first direction, and
a ratio of the dimension along the first direction to a dimension of each of the rectangular regions along the second direction is within a range between 0.4 and 2.5 inclusive.

5. The IGBT according to claim 1, wherein:
a plurality of rectangular regions are aligned in a first direction and are staggered in a second direction that is orthogonal to the first direction by alternately shifting the rectangular regions by an amount of half a dimension of each of the rectangular regions along the first direction;
the emitter region and the body region are formed in each of the plurality of rectangular regions; and
a ratio of the dimension along the first direction to a dimension of each of the rectangular regions along the second direction is within a range between 0.4 and 2.5 inclusive.

6. The IGBT according to claim 1, wherein the rectangular region is square.

7. The IGBT according to claim 1, wherein the trench is bent at an angle of 90 degrees at the corner in the plan view.

8. The IGBT according to claim 5, wherein:
the plurality of rectangular regions are defined by the trench in the plan view of the semiconductor substrate on the first major surface side;
the plurality of rectangular regions are aligned in a first direction and are staggered in a second direction that is orthogonal to the first direction by alternately shifting the rectangular regions by an amount of half a dimension of each of the rectangular regions along the first direction;
the emitter region and the body region are formed in each of the plurality of rectangular regions; and
a ratio of the dimension along the first direction to a dimension of each of the rectangular regions along the second direction is within a range between 0.4 and 2.5 inclusive.

* * * * *